United States Patent [19]

Walls

[11] Patent Number: 4,968,908

[45] Date of Patent: Nov. 6, 1990

[54] METHOD AND APPARATUS FOR WIDE BAND PHASE MODULATION

[75] Inventor: Fred L. Walls, Boulder, Colo.

[73] Assignee: The United States of America as represented by the Secretary of Commerce, Washington, D.C.

[21] Appl. No.: 319,197

[22] Filed: Mar. 6, 1989

[51] Int. Cl.$^5$ .......................... G06G 7/00; H03K 5/00
[52] U.S. Cl. .................... 307/529; 307/262; 328/109; 328/155; 328/55
[58] Field of Search ...................... 328/109, 23, 16, 55, 328/155, 134; 333/218; 307/511, 529, 479, 271, 262

[56] References Cited

U.S. PATENT DOCUMENTS

| | | | |
|---|---|---|---|
| 3,050,700 | 8/1962 | Powers | 328/55 |
| 3,475,626 | 10/1969 | Holzman et al. | 328/55 |
| 3,506,930 | 4/1970 | Gantick | 332/16 |
| 3,760,280 | 9/1973 | Covington | 328/55 |
| 4,355,289 | 10/1982 | Beyer et al. | 332/17 |
| 4,565,980 | 1/1986 | Ashida | 332/16 R |
| 4,717,894 | 1/1988 | Edwards et al. | 332/20 |
| 4,734,591 | 3/1988 | Ichitsubo | 333/218 |
| 4,739,279 | 4/1988 | Pion | 307/511 |
| 4,768,000 | 8/1988 | Pavio, Jr. et al. | 307/529 |
| 4,808,936 | 2/1989 | Lamb | 307/529 |

OTHER PUBLICATIONS

F. L. Walls et al., "Extending the Range and Accuracy of Phase Noise Measurements", Proceedings of the Symposium on Frequency Control, Jun. 1988.

Al. L. Lance et al., Infrared and Millimeter Waves, vol. II, pp. 239–289, Chapter 7.

Primary Examiner—Stanley D. Miller
Assistant Examiner—Richard Roseen
Attorney, Agent, or Firm—Thomas Zack; Alvin J. Englert; Stephen A. Becker

[57] ABSTRACT

A phase modulator for use in a two-oscillator phase noise measurement system is placed in the line from either the reference oscillator or the device under test. The phase modulator couples a small portion of the input signal to an amplitude modulator and phase shifter to shift the small signal by exactly 90 degrees. The small signal portion is then coupled back into the input signal such that small variations in the coupled signal result in phase modulation and not amplitude modulation which would undermine the calibration of the instrument. The phase modulator described can also be used with known devices of many types to correct the added phase noise of components, e.g., power amplifiers.

18 Claims, 6 Drawing Sheets

METHOD AND APPARATUS FOR WIDE BAND PHASE MODULATION

TECHNICAL FIELD

This invention relates to apparatus for the measurement of phase noise. More particularly, this invention relates to instrumentation and the calibration thereof for the measurement of phase noise in electrical apparatus over a large range of frequencies.

BACKGROUND ART

The ability of communication, navigation, and a wide variety of frequency and timing measurement equipment to perform properly is determined in part by their phase noise performance. A common aspect of their design, manufacture, calibration, and ultimate use is the phase noise introduced by such equipment. Other performance parameters are certainly present and important but are often relatively more simple to predict, calibrate and control than phase noise performance. Various techniques have been used to measure the phase noise over portions of the range covered by the technique to which this invention is directed but with much reduced accuracy and/or added complexity. A survey of previously available techniques is described in section III of *Extending the Range and Accuracy of Phase Noise Measurements* by F. L. Walls et al, published in the Proceedings of the Symposium on Frequency Control, June 1988 Section IV A of that publication also describes the performance of the present system and section IV B outlines the measurement sequence used with the present invention. The article is incorporated herein by reference. Chapter 7 of *Infrared and Millimeter Waves*, Vol II, pp. 239-289, by A. L. Lance et al also describes previously available techniques of phase noise measurement.

Specifically, and to briefly summarize these publications, the single oscillator techniques described yield a good resolution (noise floor) over a rather restricted range of Fourier frequencies. In order to measure the phase noise of a 10 GHz oscillator from 0.01 HZ to 1 GHz from the carrier would require from 5 to 10 different delay lines or reference cavities Some of the cavities probably would have to be cryogenic to obtain the necessary resolution to measure the best sources that are available. In order to have good resolution using delay lines, the radio frequency (RF) signals would have to be encoded on optical carriers and transmitted on optical fibers. This technique is expensive and still falls short of the resolutions available with the two oscillator techniques described below.

Figure 1:
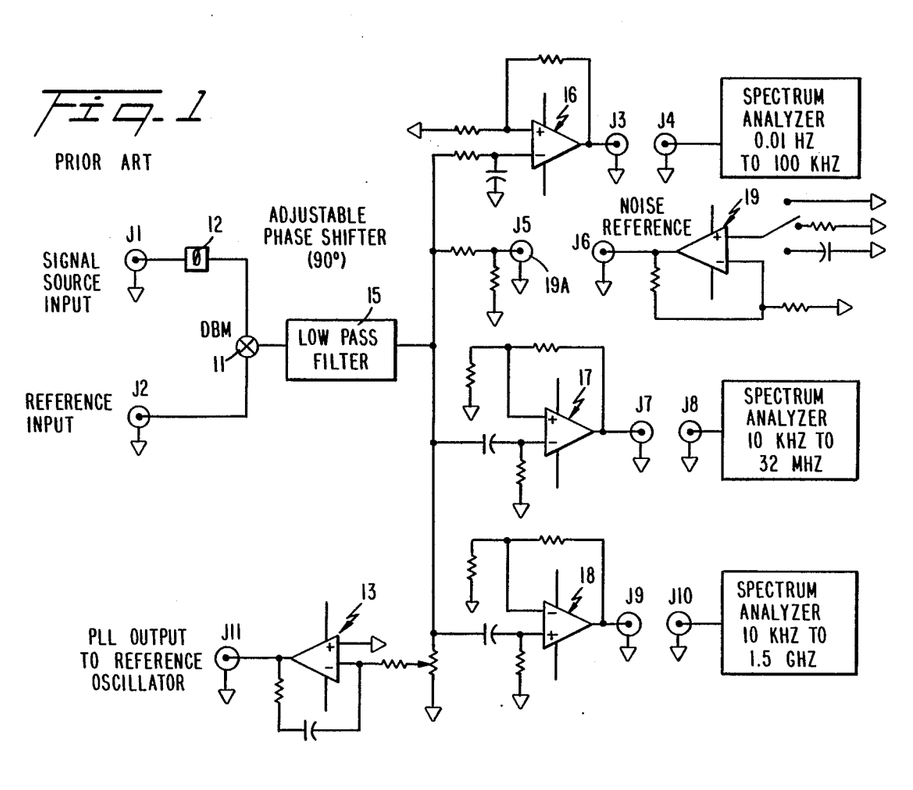
FIG. 1 is a block diagram of a conventional two oscillator phase noise measurement system.

The currently known two oscillator techniques have the best resolution over the entire measurement range. A typical block diagram of an arrangement to measure the phase noise of a precision source is shown in FIG. 1. FIG. 1 shows the use of a double balanced mixer (DBM) 11 receiving an input from a device under test, such as a precision signal source, at J1 and a reference signal input at J2. As will be clearly understood, these inputs are interchangeable since it is the phase difference between them that is the subject of measurement of the system. Both of the signals are provided as inputs to a double balanced mixer (DBM) 11, which is connected in a manner to cause it to function as a multiplier, and outputs the sum and difference frequencies of the inputs. As is well understood in the art, a double balanced mixer can be made to perform different functions, including those of a multiplier, as here, or an amplitude modulator, as will be discussed below, depending upon the ports to which inputs are applied.

Since the frequencies of the inputs to the DBM differ only by the amount of phase change being measured, the sum and difference frequencies will be widely separated and the sum frequency signal can be easily filtered out by low pass filter 15. The output of filter 15 is then provided to a bus which is connectable to one or more amplifiers which may be of either a dc coupled type 16 or ac coupled type 17, 18 configuration and thence to spectrum analyzers optimized for various frequency bands. For purposes of calibration of the spectrum analyzers, a noise reference 19 can be injected onto the bus at 19A, as illustrated, in a manner well-understood in the art Specifically, for measurements where either the device under test or the reference source is voltage tunable, the signal on the bus can be amplified or attenuated as needed, filtered and fed back to the voltage tunable unit to maintain 90 degrees phase shift between the signals at the mixer as shown at 13 of FIG. 1. This nominally occurs at zero dc volts out of the mixer In this case, phase shifter 12 can be set to any value including zero. For measurements where the phase of neither signal is adjustable, for example, measurements on an amplifier, where the reference signal drives $J_2$ and $J_1$ through the amplifier, adjustable phase shifter 12 is essential to achieve the 90 degrees phase shift Arrangements such as that of FIG. 1 exploit the fact that if the two oscillators (e.g. the reference or carrier frequency and the modulation reference frequency) are permitted to beat slowly against each other, the slope of the resulting waveform at zero output voltage from the mixer will have a value, in units of volts per radian, which is substantially a constant For small phase deviations from zero output, the sine of the phase angle (i.e., the dc output voltage is approximately linear with phase deviation and will be a measure of the phase noise angle-to-voltage conversion constant in volts per radian The difficulty with this approach in the past has been due to the fact that there has been no precision technique for isolating the changes in the slope which were due to frequency or amplitude dependent amplitude characteristics of the measurement system Specifically, there had been no way to achieve a correction for the lumped frequency and amplitude characteristics of the measurement system at a particular carrier frequency and, therefore, no way to derive a high accuracy value for a constant relating the output voltage to the actual value of the phase noise as a function of Fourier frequency offset from the carrier signal.

The essence of the calibration of such a system is to accurately determine the conversion sensitivity of the mixer for transforming small changes in phase into changes in voltage as a function of the frequency of the phase change. The basic difficulty encountered is that virtually any frequency dependent variation in phase or voltage in any part of the system will result in a change in the voltage output, as is well understood in the art, while only those associated with a change due to the input phase noise of the input carrier signal from the device under test and the input reference source are of interest and must be isolated for high-accuracy measurements. This is complicated by the fact that the mixer output impedance has both resistive and reactive components whose value depends on the drive levels and the mixer termination. It is usually possible to obtain a very accurate measurement of this phase conversion for small changes occurring at a rate of less than 10 kHz By carefully terminating the mixer in resistive loads it is possible to extend measurements up to 40 MHz in some cases with somewhat reduced accuracy and signal-to-noise ratio. The extrapolation to larger Fourier frequencies is extremely difficult because the output impedance of the mixer is active and frequency dependent. While high frequency errors in amplitude of detected phase noise are due to frequency dependent variations in amplifier gain, low frequency errors are due to the phase locked loop. These facts, coupled with the inherent small variations in amplifier gain with input impedance, frequency, and temperature makes it virtually impossible to obtain this conversion coefficient with an accuracy equal to or better than 10% (1 dB) over a wide range of Fourier frequencies.

As a solution to this problem, one might envision running one input signal at a high level and sweeping the other input signal while maintaining its level so low as not to saturate the IF amplifiers following the mixer. Unfortunately the mixer output impedance is a function of the drive levels and running one source at a low level changes its characteristics This invalidates the calibration at the level of accuracy desired Another approach is to insert a phase modulator directly in one of the lines. Here again, the approaches that have been used in the past added a significant amount of noise Many of them are relatively narrow band devices such as cavities, which require many diverse devices to measure a wide range of carrier frequencies.

Still another approach is to insert a reference frequency into the output of the mixer. This approach has considerable merit but is even more difficult to implement since the reference signal must be flat from under 0.01 Hz to over 1 GHz (11 decades in frequency).

DISCLOSURE OF THE INVENTION

Accordingly, it is an object of the invention to provide a phase modulator which inherently adds little phase or voltage noise to the overall system in which it is placed.

It is another object of this invention to provide a phase modulator of extremely flat characteristics over extreme ranges of frequency.

It is a further object of the invention to provide a phase modulator operable over a wide range of frequencies in which signal delay means are minimized in number and constitution and are of a commonly available and economical type. It is a yet further object of the invention to provide a phase modulator which has little effect on the amplitude of the signal presented to the mixer of a two oscillator type phase noise measurement system.

It is a yet further object of the invention to provide a precise phase modulation signal which is constant with modulation frequency in order to correct the measurement system for changes in amplifier gain with frequency in the measurement system.

The above and other objects are satisfied, in accordance with one aspect of the invention, by a phase modulator which uses a small portion of an input signal coupled therefrom that is phase shifted and returned to the input signal, thereby minimizing introduction thereto of phase noise.

In accordance with another, more specific, aspect of the invention, a small portion of the input signal is shifted by 90 degrees so that amplitude variations in the small portions of the input signal lead to phase, and not amplitude, modulation.

In accordance with a further aspect of the invention, a phase modulator is provided in which, over an extremely wide band of frequencies, phase shift is adjusted within a range of frequencies of interest by observation of amplitude variation and is compensated to minimize such amplitude variation In accordance with a yet further aspect of the invention, a phase modulator is provided where common devices such as lengths of coaxial cable, wave guides, cavities and the like, may be used in selectable combinations with a continuously adjustable device for imparting a small delay to provide a phase shift of precisely 90 degrees at a selected input carrier frequency which may assume values over an extremely wide range of frequencies of interest. This phase shift of 90 degrees assures that the insertion of phase modulation in the measurement system does not result in a significant amplitude component in the output signal Moreover, the phase shift of 90 degrees need not even be measured since the delay can merely be adjusted for a given input carrier frequency until no amplitude variation is observed in the output signal, thus effectively compensating for the lumped frequency dependent characteristics of the entire measurement system.

These and other objects, features and advantages of the invention will become apparent to persons skilled in the art in view of the following detailed description of the invention, of which, the best mode of carrying out the invention known to the inventor is set out for the purpose of enabling the construction and use of the invention. Therefore, it is to be understood that the following description is made by way of example and not of limitation.

BEST MODE FOR CARRYING OUT THE INVENTION

Figure 2:
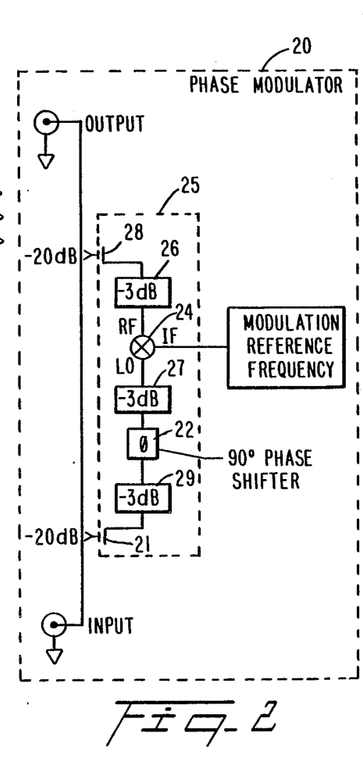
FIG. 2 is a block diagram of a phase modulator in accordance with the present invention.

Fundamentally, the invention includes a particular phase modulator arrangement, which, when implemented in a two oscillator phase noise measurement system, effectively isolates amplitude variations with Fourier frequencies occurring throughout the system which do not originate from the phase noise being measured The phase modulator according to the invention also permits calibration of the system to achieve this benefit over an extremely wide band of frequencies. The phase modulator according to the invention is illustrated at FIG. 2. FIG. 2 basically shows a phase modulalator which preferably includes a connection between the input and output which includes two directional couplers and a signal processing path 25. The arrangement functions to extract approximately 1 to 10% (−20 to −10 dB) of the input signal, processing that extracted signal and to couple the processed, extracted signal back into the input signal, causing virtually no amplitude alteration of the input signal.

The basic concept of the new ultra flat, low-noise phase modulator will be described in detail with particular reference to in FIG. 2. A small portion of the input signal, typically −10 dB to −20 dB, is coupled out of the input signal using a directional coupler 21. The coupled port is terminated with an attenuator 29 or perhaps an isolator or circulator in order to obtain the best directivity. This attenuator functions to eliminate resonances, reducing the standing wave ratio (SWR) to a negligible level This signal is then applied through a dc coupled variable attenuator, including fixed and variable delay means such as phase shifter 22 and pad 27 to aid in stabilizing the attenuator input impedance. A bi-phase attenuator such as a double balanced mixer is well suited to this task. Mixer 24, in this case, is connected in a manner to provide amplitude modulation of the small signal by the reference frequency. The amplitude modulation due to element 24 could be provided equally well by a variable amplifier with the gain greater or less than one. The phase shifter 22 is generally just a plurality of pieces of coax cable, wave guide, dielectrically loaded wave guide or other commonly available delay devices, which are switchable or adjustable to provide the amount of delay or phase shift desired.

The signal is applied through a further attenuator or pad 26 and then is coupled back into the main signal using another directional coupler 28. By adjusting the phase shift it is possible to make the small signal coupled back into the main signal to be exactly 90 degrees out of phase with the primary signal Small amplitude changes in this coupled signal then lead to phase modulation and not amplitude modulation.

In particular in the preferred embodiment, if the variable attenuator is a double balanced mixer, the small signal coupled back into the input alternately varies from +90 degrees to −90 degrees out of phase. This can be visualized by considering the input signal as a large vector and the signal coupled back into it as a smaller vector switching back and forth between +or −90 degrees out of phase therewith. As long as the signal coupled back into the input signal is comparatively small, which condition is established by the directional couplers, the magnitude of the resulting vector, corresponding to the signal amplitude, will be substantially identical to that of the input signal and phase noise will be entirely represented by the phase of the vector, the variation in which will be virtually unchanged with respect to the input signal vector, producing the desired isolation between the phase noise being measured and the amplitude vs Fourier frequency variations of the measurement system.

The modulator of the invention preferably operates on only a very small fraction of the input signal which inherently leads to very small added noise The insertion loss typically is less than 1.5 dB which is low enough that it generally has little effect on power necessary to drive the mixer properly This is important, since, as pointed out above, the mixer gain is, in part, dependent on input signal amplitude, and, thus, the insertion of the phase modulator in the signal path has little effect on the ultimate resolution of the system Increasing the value of the extracted signal would permit larger phase variations of the output signal at the expense of increasing the insertion loss, i.e., reduction of the amplitude of the output signal For instance, in an application of the phase modulator of this invention for compensating the phase variation of a power amplifier it may be desirable to increase the value of the coupled signal up to 50% of the input signal power to obtain sufficiently large phase variation in the output signal notwithstanding insertion loss. The design used here has been demonstrated to work over a very wide range of carrier frequencies up to at least 300 to 1 thereby greatly reducing the complexity required for a general purpose machine The resulting phase modulation signal is inherently very flat for modulation frequencies from dc out to 5 to 40% of the carrier frequency. The exact performance depends on the quality of the components. Moreover, the hardware necessary to implement the invention are standard devices which are readily available.

Although this embodiment has been described particularly as applied to radio frequencies and the microwave region of the spectrum, similar arrangements are applicable to devices operating at virtually any frequency from sub-audio to optical frequencies.

The invention permits measurement of the phase noise of such devices with a resolution of approximately 0.2 dB and an accuracy of better than 1 dB over a much larger bandwidth than possible with any previous precision technique.

The simplicity and effectiveness of the arrangement of the invention may be appreciated by noting that by observing the amplitude modulation, the phase shift may be adjusted very accurately so that the induced amplitude modulation at given Fourier frequency f is from 20 dB to more than 40 dB below the induced phase modulation at Fourier frequency f. In other words, the system may be accurately calibrated using the technique described below by adjusting the delay at phase shifter 22 at a particular carrier frequency to a value where no induced amplitude modulation at f is observed In this case the modulation on the signal is very accurate phase modulation at a Fourier frequency f. It does not particularly matter for this use whether there are other harmonics of the modulation signal present or not. The variable attenuator can be made to operate from dc to a very large frequency. In many cases the upper limit of the modulation frequency exceeds 40% of the input carrier frequency rather than a practical limit of less than 10 KHz as noted above for the lowest noise floor (best signal to noise ratio) or 40 MHz in general applications.

Figure 3:
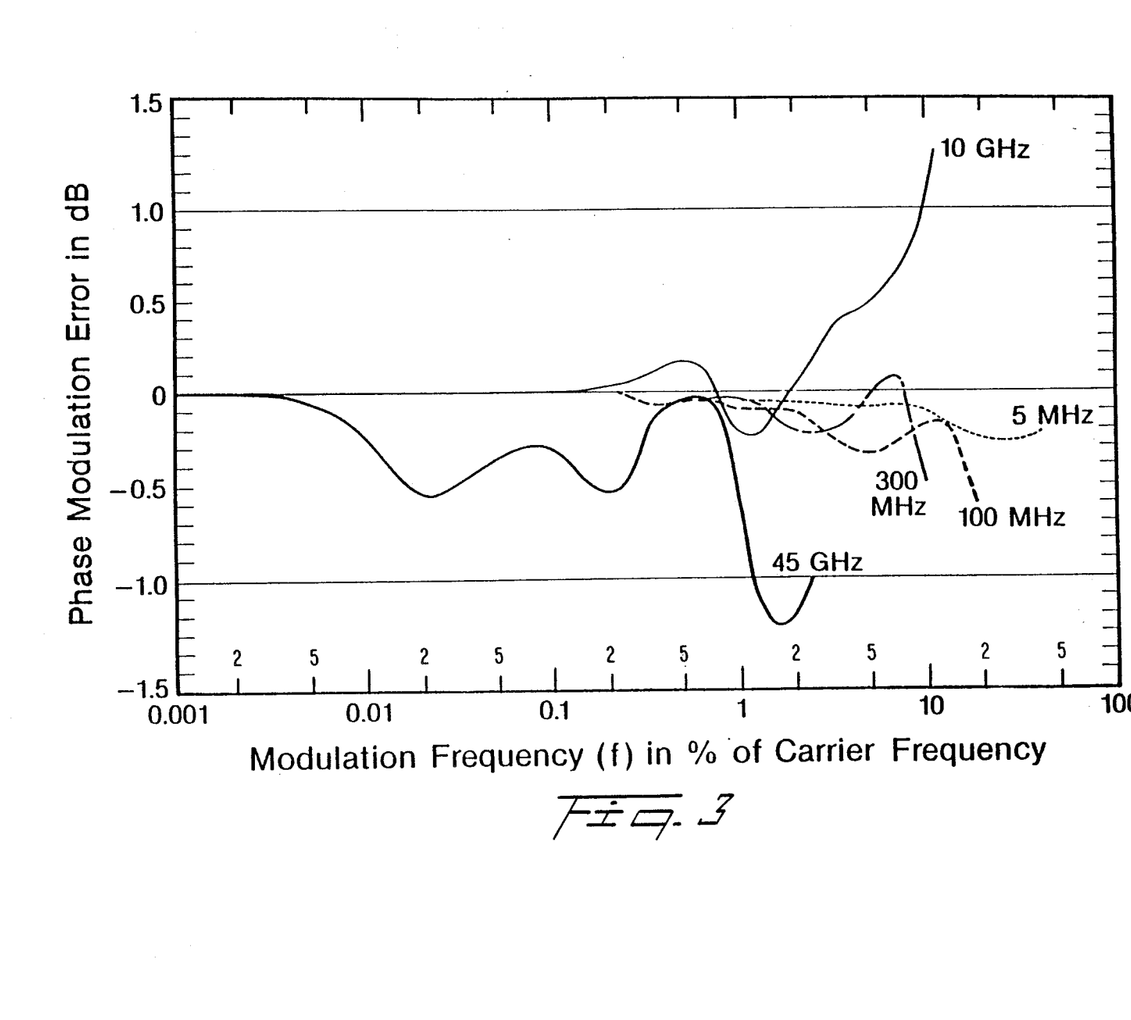
FIG. 3 is a graph of the error in the amplitude of the modulation signal versus Fourier frequency according to the invention.

FIG. 3 shows the error in the amplitude of the modulation signal versus Fourier frequency in units of percent of the carrier frequency The curve labeled 45 GHz depicts the results on a phase modulation realized in an embodiment of the invention constructed with WR 22 wave guide (33–50 GHz). The curve labeled 10.6 GHz is the result on a system with the delay structure fabricated in coax which should operate equally well from at least 4 to 18 GHz. The curve labeled 5, 10, 100, and 300 MHz are results from a single modulator tuned up for the various frequencies by adjusting only the phase shift 22 in FIG. 2 to achieve + or −90 degrees, i.e., minimum amplitude modulation. This modulator operates from 5 MHz to about 1.5 GHz. In all cases the components are readily available With components which have lower voltage standing wave ratio and more directivity in the directional couplers, the results should be as flat as that shown for 5 MHz for all frequencies up to 40% of the carrier signal frequency.

Figure 4:
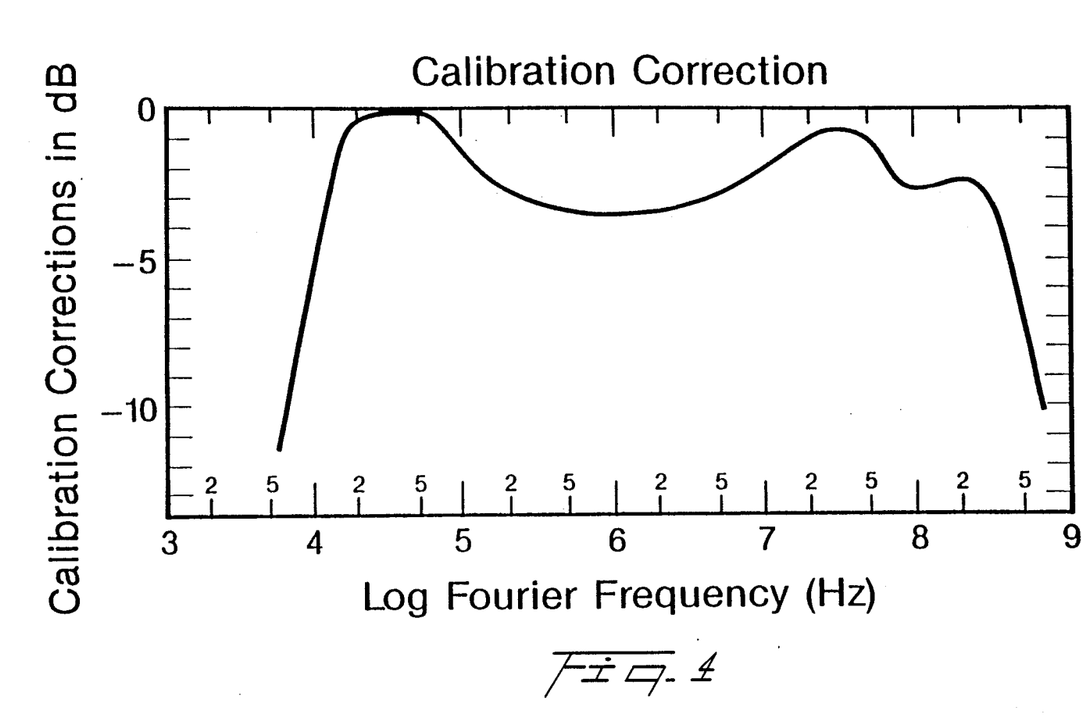
FIG. 4 is a graph of the actual calibration correction versus the logarithm of the Fourier frequency according to the present invention used at 10 gHz.

Using these modulators to provide a phase modulation signal that is flat over the Fourier frequencies of interest, one can readily calibrate the relative sensitivity for converting small phase changes to small voltage changes of the mixer in conjunction with the various amplifiers following the mixer, their associated spectrum analyzers, the phase lock loop, and even the connecting cables A typical calibration correction curve at 10 GHz is shown in FIG. 4. The absolute sensitivity is then determined at one frequency with the dc coupled amplifier by allowing the two oscillators to beat slowly and measuring the beat period and the slope through the zero crossing, as discussed above, with an accuracy of 1 to 2% (0.1 to 0.2 dB). The large correction at low Fourier frequencies compensates for the effect of the phase locked loop while those at high Fourier frequencies compensate for frequency dependent gain variations of the amplifier. The precision for this total calibration is about 0.2 dB using existing equipment, however the concept is valid for obtaining even better results.

An interesting feature of using the double balanced mixer as the variable bi-phase attenuator is that the amplitude of the transmitted signal asymptotically approaches a maximum value that is independent of the amplitude of the driving signal. This helps make the reference phase modulation relatively independent of small changes of the amplitude of the reference signal as it is swept over the range of Fourier frequencies of interest.

If the directional couplers have good directivity and the mixer input impedance is stabilized, either by always maintaining the same drive level or using a small attenuator between the phase modulator and the mixer, the modulation phase angle is constant and can be used as a calibration standard without any other measurements. Such a device can then be used to provide an absolute calibration for other phase noise measurement systems, even single oscillator systems that otherwise lack accuracy but have adequate resolution. For this use it is important that the modulation signal be free of amplitude modulation to at least −10 dB below the phase modulation since the detection of the amplitude modulation signal depends on the degree of saturation in the mixer, as noted above.

Figure 1A:
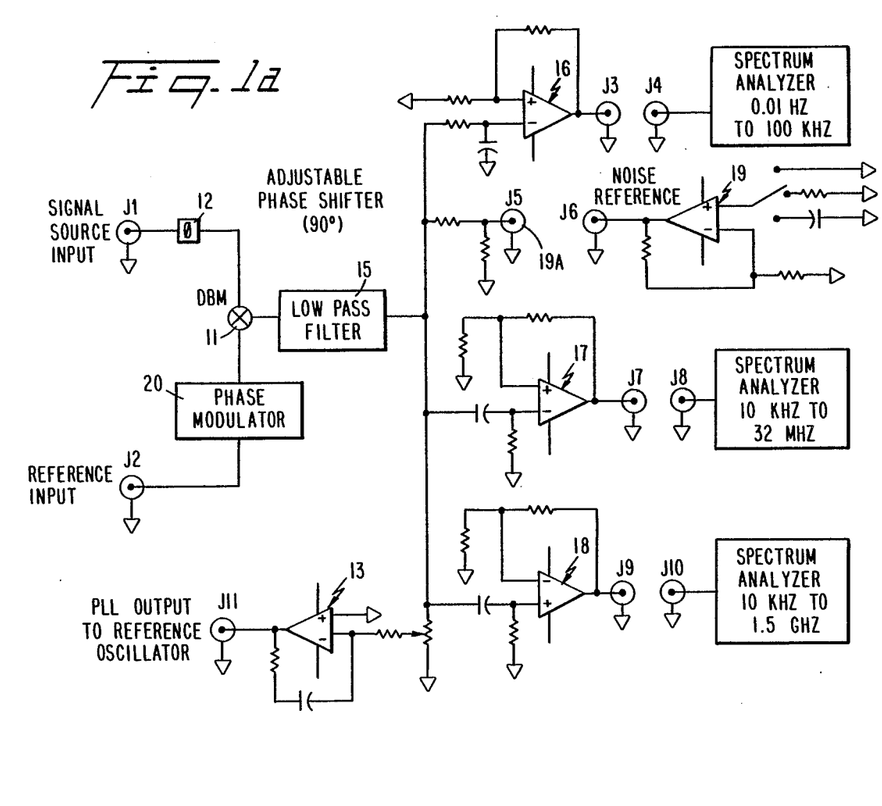
FIG. 1a is a block diagram showing the relationship of the phase modulator of FIG. 2 to FIG. 1 according to the invention.

A block diagram of a two oscillator phase noise measurement system including the phase modulator of FIG. 2 is shown in FIG. 1a. Phase modulator 20 is inserted into the input line from input J2, by means of directional couplers as will now be described.

Figure 5:
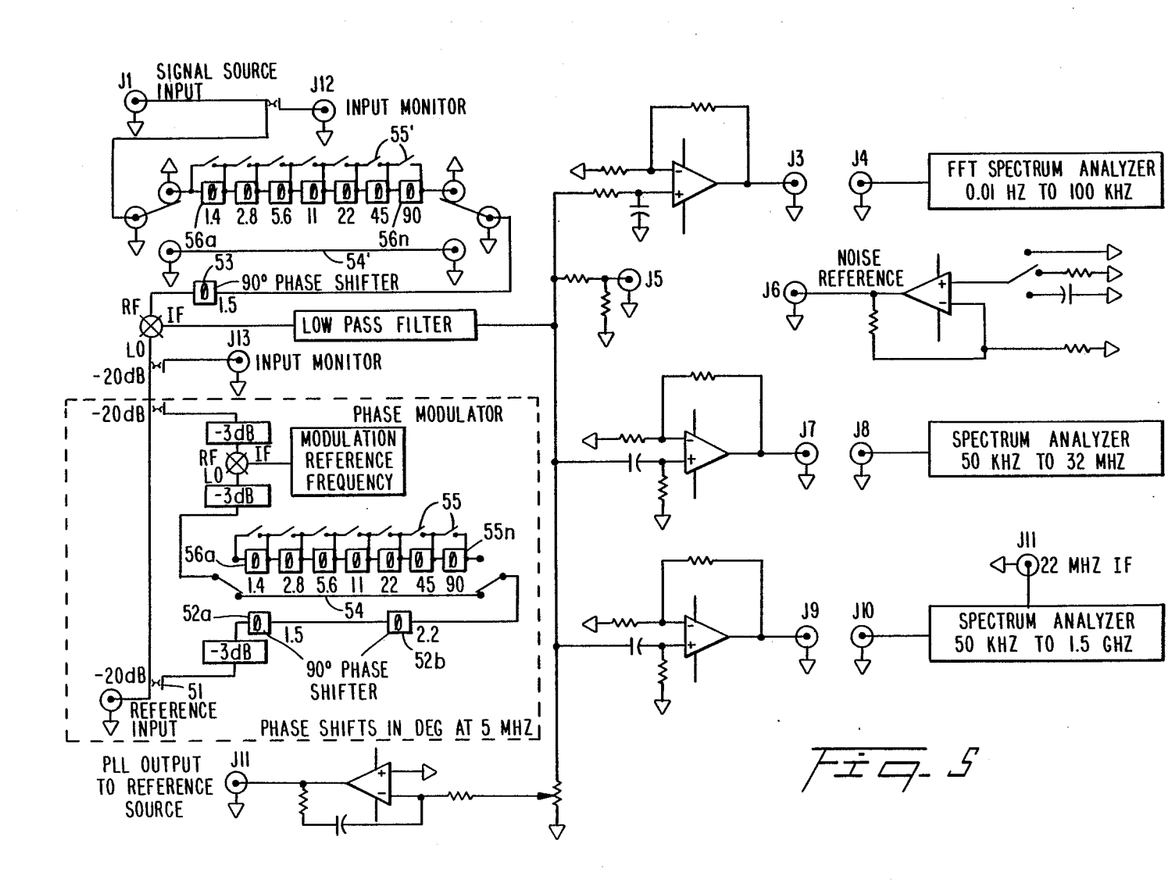
FIG. 5 shows an implementation of the invention within a two oscillator phase noise measurement system.

A detailed schematic of the present invention is illustrated at FIG. 5. It will be realized that FIG. 5 shows the use of the modulator of FIG. 2 in substantially greater specificity and detail inserted into the overall arrangement of FIG. 1 The phase shifts noted in legends of FIG. 5 are delays equivalent to stated phase shifts in degrees at 5 MHz. The reference input is provided to directional coupler 51, connected to an attenuator to improve directivity, as noted above and, thence, to an adjustable phase shift 52a and a compensating delay 52b. The phase shifter 22 of FIG. 2 is illustrated as embodied as a series of waveguides or coax 56–56n, each portion of which related to the delay provided by an adjacent section by a factor of two and is provided with a selectable shunt such as at 55.

It should be noted that, in FIG. 5, switchable lengths of coax cable are used to provide the major amount of signal delay. Of course it will be realized that other adjustable phase delay devices can be used. The smallest switched delay is made somewhat smaller than the amount of delay available in a continuously adjustable manner at 52a. An overall shunt of this delay means is provided at 54 This shunt is convenient for calibration of the arrangement since each of the switches 55 is somewhat lossy and provision of shunt 54 yields substantially higher calibration accuracy than merely closing all of switches 55. Shunt 54 is also useful at higher frequencies (e.g. in the gigahertz range) where adjustable delay 52a will be sufficient to obtain the necessary phase shifts The remainder of the phase modulator of FIG. 5 follows that of FIG. 2 The input (J1) branch of FIG. 5 includes a matched delay arrangement similar to that provided in the phase modulator. The selectable fixed delays $56a'–56n'$ which are switchable at 55', in combination with continuously adjustable delay 53 assure that an exact phase shift of 90 degrees can be obtained as shown in FIG. 1 when testing passive components or other units where the frequency cannot be conveniently adjusted. When testing voltage adjustable oscillator the phase lock loop (PLL) output is used to maintain 90 degrees at the mixer as explained above. The input signal can be monitored by the use of directional couplers symmetrically arranged in both input branches as illustrated at J12 and J13.

The arrangement illustrated in FIG. 5 provides a system that operates over carrier frequencies of 5 MHz to 1.5 GHz. Similar systems covering 4–18 GHz and 33–50 GHz have also been tested. It will be evident that FIG. 5 essentially illustrates an overall system similar to FIG. 1 but as an implementation including the phase modulator according to the present invention, enabling the enhanced performance indicated above.

It should also be evident that a simple servo system could be used to automatically adjust the phase shift so that the induced incidental amplitude modulation is minimized This could be done at the beginning and verified at the end of the calibration cycle. This could be achieved by detecting the amplitude modulation at J13 with a synchronous detector referenced to the modulation signal. The error signal is then used to drive the modulator phase shift to minimize the amplitude modulation The improved phase modulator according to the invention could be used as the key element in new phase noise measurement systems It uniquely provides the capability for measuring the phase noise with 3 to 10 times the accuracy over a Fourier frequency bandwidth that is decades larger than presently available systems. The design is inherently easy to monitor and utilize using computer control.

A second use is as a calibration standard that is used in conjunction with present systems that have much lower accuracy. For instance, the typical uncertainty of the present commercial analyzers is 2 to 6 dB. At present, there are numerous measurement applications for which this degree of uncertainty renders them unsatisfactory. Instrument-to-instrument variations on the same order of magnitude are also typical throughout the industry. The phase modulator of the present system is well-suited to providing an upgrade, either in initial manufacture or by retrofitting the invention into existing devices for many commercially available instruments since it may be directly substituted for portions of the circuitry, as illustrated by comparison of FIG. 1 with FIG. 5, without alteration of the hardware architecture of the instrument itself This basic phase modulator can also be used to correct the added phase noise of power amplifiers where the added phase noise is detected using a standard scheme similar to FIG. 1 and the output signal from $J_3$ could then be used to drive a phase modulator such as shown in FIG. 2. This approach has many virtues since it adds virtually no noise and the active part of the modulator carries only a very small portion of the total signal. This has been tested using a double balanced mixer as the attenuator, however the alignment was difficult. The use of a linear attenuator would greatly improve its performance.

From the foregoing description of the invention and the preferred embodiment, it will be understood that a phase modulator capable of extremely flat performance over a wide range of carrier frequencies has been provided which introduces a negligible amount of phase noise into any system in which it is included by extracting a small portion of an input signal, phase shifting the extracted portion by 90 degrees, amplitude modulating the small extracted portion by a reference frequency in a double balanced mixer and reinjecting the processed signal into the input signal. The modulator so provided has the added feature that the phase shift may be achieved by delay means which may be fabricated from well known, readily available and inexpensive materials and a single delay medium, such as wave guide, dielectrically loaded wave guide, coax or other delay device, is made applicable to a wide range of frequencies. Calibration at a given carrier frequency inherently compensates for lumped frequency dependent gain and phase variations in the entire phase modulator.

Having thus fully described the invention and explained numerous possible applications thereof, it is evident that many variations and other applications of the disclosed invention will be apparent to those skilled in the art without departing from the spirit and scope of the invention disclosed. Therefore it is intended that the foregoing description be taken as being by way of example; the scope of the invention being limited only by the appended claims.

What is claimed is:

1. A wide band phase modulator having an input signal path receiving an input signal, comprising
   first coupling means for coupling a portion of the input signal out of said input signal path,
   adjustable delay means for phase shifting said portion of said input signal by 90 degrees at a range of frequencies of interest to provide a phase shifted portion,
   modulation means for modulating the amplitude of said phase shifted portion of said input frequency with a reference frequency source, and
   second coupling means for coupling an output of said modulation means into said input signal path.

2. For a phase noise measurement system, a method for detecting frequency dependent variations in the response characteristic of said noise measurement system over a wide band of frequencies comprising the steps of
   extracting a small portion of an input signal,
   phase shifting the extracted portion by 90 degrees,
   modulating the amplitude of the phase shifted signal with a reference frequency, and
   reinjecting the modulated signal into the input signal,
   multiplying the input signal with a reference frequency signal, and
   low-pass filtering the result of said multiplying step,
   whereby a waveform at the reference frequency is produced having constant amplitude for reference frequencies from infrasound frequencies to approximately 40% of a carrier frequency of the input signal.

3. The method of claim 2 wherein the power of said small portion extracted from said input signal is up to 50% of the power of said input signal 4. The method of claim 2 wherein the power of said small portion extracted from said input signal is equal to or less than 10% of the power of said input signal.

5. The method of claim 2 wherein the power of said small portion extracted from said input signal is less than 1% of the power of said input signal.

6. A method of improving, over a wide range of frequencies, phase noise performance of an electrical apparatus including a phase modulator having applied thereto an input signal, including the steps of:
   extracting a portion of said input signal applied to said modulator to provide an extracted portion;
   phase shifting the extracted portion by 90 degrees to provide a phase shifted signal;
   amplitude modulating the phase shifted signal with a reference frequency signal to provide a modulated signal; and
   reinjecting the modulated signal into the input signal.

7. A method of improving, over a wide range of frequencies, phase noise performance of an optical apparatus including a phase modulator having applied thereto an optical input signal, including the steps of:
   extracting a portion of said optical input signal applied to said modulator to provide an extracted portion;
   phase shifting the extracted portion by 90 degrees to provide a phase shifted signal;
   amplitude modulating the phase shifted signal with a reference frequency signal to provide a modulated signal; and
   reinjecting the modulated signal into the input signal.

8. A wide band phase modulator having an input signal path receiving an input signal, comprising:
   first coupling means for coupling a portion of the input signal from said input signal path;
   adjustable delay means for phase shifting said portion of said input signal by 90 degrees to provide a phase shifted portion;
   modulation means for modulating the amplitude of said phase shifted portion of said input signal with a reference frequency signal; and
   second coupling means for coupling an output of said modulation means to said input signal path.

9. The wide band phase modulator of claim 8 wherein said first and second coupling means comprise respective directional couplers.

10. The wide band phase modulator of claim 8 further comprising attenuator means for reducing an amplitude of said portion of said input signal coupled by said first coupling means.

11. The wide band phase modulator of claim 8 further comprising attenuator means for reducing an amplitude of said phase shifted portion of said input signal phase.

12. The wide band phase modulator of claim 8 further comprising attenuator means for reducing an amplitude of said output of said amplitude modulation means.

13. The wide band phase modulator of claim 8 wherein said modulation means includes a mixer for mixing said phase shifted portion of said input frequency with said reference frequency signal.

14. The wide band phase modulator of claim 8 wherein said adjustable delay means comprises a phase shifter circuit.

15. The wide band phase modulator of claim 14 wherein said phase shifter circuit comprises a series of transmission lines and means for selectively bypassing selected ones of said transmission lines.

16. A wide band phase noise measurement system for measuring a phase noise of an test signal, including:
   input signal means for receiving said test signal;
   a modulator having an input signal path receiving a first reference signal, said modulator including
   (i) first coupling means for coupling a portion of the first reference signal from said input signal path,
   (ii) adjustable delay means for phase shifting said portion of said first reference signal by 90 degrees to provide a phase shifted portion,
   (iii) modulation means for amplitude modulating said phase shifted portion of said first reference signal with a second reference frequency signal, and
   (iv) second coupling means for coupling an output of said modulation means to said input signal path to provide a third reference signal;
   mixer means for combining said test signal from said input signal means and said third reference signal from said modulator to provide an output signal.

17. The wide band phase noise measurement system of claim 16, further comprising a spectrum analyzer receiving said output signal.

18. The wide band phase noise measurement system of claim 16, further comprising a low pass filter receiving said output signal from said mixer means and providing a filtered output signal; and
   a spectrum analyzer receiving said filtered output signal.

* * * * *